United States Patent [19]

Darrow

[11] 4,368,440
[45] Jan. 11, 1983

[54] FAIL-SAFE LOW-PASS FILTERING CIRCUIT

[75] Inventor: John O. G. Darrow, Murrysville, Pa.

[73] Assignee: American Standard Inc., Swissvale, Pa.

[21] Appl. No.: 199,779

[22] Filed: Oct. 23, 1980

[51] Int. Cl.³ .............................................. H03H 7/10
[52] U.S. Cl. ................................. 333/172; 307/271; 307/570; 333/174
[58] Field of Search ....................... 330/302, 303, 305; 307/271, 445, 446, 570, 571, 580, 582, 584, 241; 333/172, 174, 167

[56] References Cited

U.S. PATENT DOCUMENTS

| | | | |
|---|---|---|---|
| 3,582,975 | 6/1971 | King | 307/570 |
| 3,868,548 | 2/1975 | Grundy | 317/5 |
| 3,883,815 | 5/1975 | Grundy | 330/144 X |
| 3,889,201 | 6/1975 | Grundy | 330/51 X |
| 3,890,577 | 6/1975 | Grundy | 330/51 X |

Primary Examiner—James B. Mullins
Attorney, Agent, or Firm—J. B. Sotak

[57] ABSTRACT

A fail-safe active low-pass filter circuit including a plurality of transistor gates having their inputs coupled to a source of a.c. signals, one of a plurality of field-effect transistor switches coupled to an associated one of the plurality of transistor gates, and a variable R-C network having a variable upper a.c. signal passing level which is determined by which one of the associated transistor gates and field-effect switches is rendered conductive by application of d.c. supply voltage.

10 Claims, 1 Drawing Figure

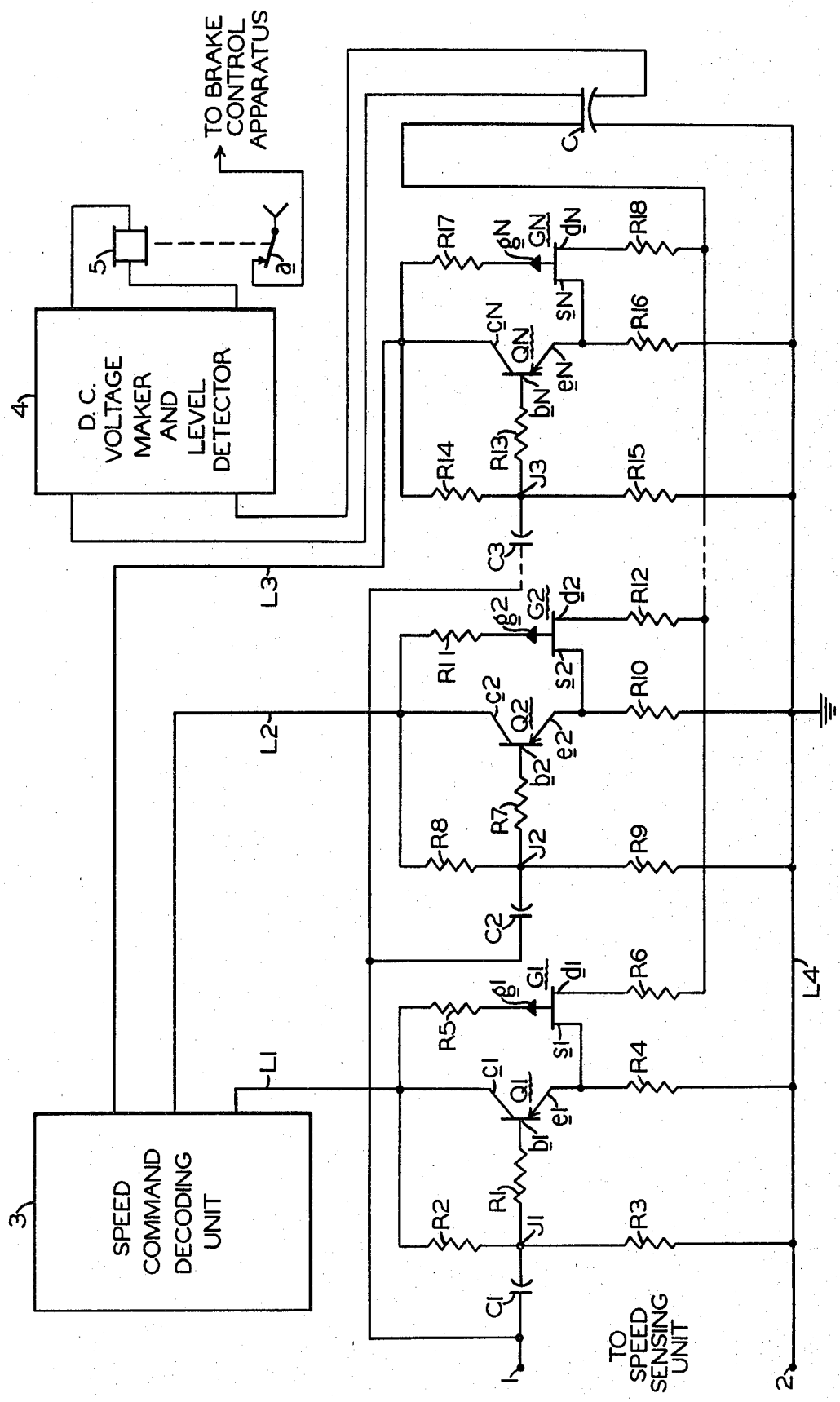

FAIL-SAFE LOW-PASS FILTERING CIRCUIT

FIELD OF THE INVENTION

This invention relates to a vital type of a variable signal frequency filtering circuit and more particularly to a fail-safe electronically controlled low-pass filter employing a selected one of a plurality of transistor gates and switches for establishing a circuit path from a source of a.c. signals to the low-pass filter and for determining an upper frequency signal passing limit for the low-pass filter.

BACKGROUND OF THE INVENTION

In various types of signal and communication systems for use in railroad and mass and/or rapid transit operations, it is is customary practice to employ cab signals to control the speed of a vehicle or train as it moves along its route of travel. Normally, the cab signals which are received on board the vehicle or train are in the form of coded carrier waveforms. That is, the carrier signal is selectively coded or modulated by one of a plurality of code or pulse rates. Each code or pulse rate signifies or represents a given maximum speed or velocity at which a vehicle or train is permitted to travel along any given block or section of trackway. In actual operation, the coded carrier signals are normally conveyed to the track rails by a transmitter connected thereto and are picked up by inductive receiver coils which are mounted forward of the front axle of the lead vehicle or locomotive. The picked up signals are amplified, demodulated, shaped, and filtered, and then the recovered signals are applied to the speed command decoding unit. One necessary and important function to be carried out in a cab signaling operation is the ability for the car-borne equipment to detect and sense overspeed conditions. That is, when the actual speed of the moving vehicle or train exceeds the authorized speed permitted in a particular track section or block area, an overspeed signal is immediately produced on board to alert the operator or trainman of the violation. In practice, this speed check is accomplished by the overspeed control equipment or speed governor portion of the car-carried cab signaling equipment. In practice, an axle generator or tachometer in the form of a frequency generator is employed to produce a.c. signals which are proportional to the actual speed of the moving vehicle. In the past, a multi-section low-pass filter was used for each speed command, and the appropriate filter section was selected by the relay contacts of the speed command decoding unit. While one previous arrangement worked quite satisfactory, it was rather large and relatively expensive since a complete printed circuit board was required for every two-speed commands. In another arrangement, a single low-pass filter was employed for accommodating all of the vehicle speeds while the speed command signals were used to vary the turns ratio of a multi-tapped transformer. Thus, the necessary gain between the filter circuit and a level detector was varied by the closing of various decoding relay contacts connected to selected taps of the transformer which was driven by an emitter-follower amplifier. That is, by applying the emitter-follower power supply through the transformer taps, various levels of gain can be selected. Further, the current requirements are designed to be very low so that either a solid-state source or a relay contact could be reset to supply power. While this latter scheme could accommodate six to eight speeds per printed circuit board, there were several shortcomings or drawbacks in such an arrangement. First, the appearance of noise or extraneous signals on the speed command inputs could result in an increase in the authorized speed command level which could cause an erroneous and unsafe overspeed point. Second, certain subtle variations in the characteristics of the multi-tapped transformer could give rise to inaccurate results, and, third, the range of speeds which could be practically used with a filter-transformer combination was limited due to the finite amount of gain that is attainable with such an emitter-follower configuration.

OBJECTS OF THE INVENTION

Accordingly, it is an object of this invention to provide a unique vital type of a variable signal frequency filtering circuit which alleviated the above-noted disadvantages.

A further object of this invention is to provide an improved fail-safe electronic controlled low-pass filter having a selectable range of signal passing frequencies.

Another object of this invention is to provide a new and improved selectable low-pass filtering circuit which operates in a fail-safe manner.

Still a further object of this invention is to provide a new fail-safe filtering circuit having a variable upper frequency signal passing limit which is selectively controlled by a plurality of electronic gates and switches.

Still another object of this invention is to provide a novel vital type of variable electronic filter which is highly immune to ripple signals on a d.c. control voltage.

Yet a further object of this invention is to provide a unique fail-safe low-frequency signal passing filtering circuit having a high immunity to noise which may be present on the d.c. supply source.

Yet another object of this invention is to provide a vital circuit arrangement comprising, a source of a.c. signals having a variable frequency, a plurality of electronic gates having their inputs coupled to the source of a.c. signals, one of a plurality of electronic switches coupled to the output of an associated one of a plurality of electronic gates, and a variable low-pass filter network having an upper signal frequency limit which is determined by which of the associated electronic gates and switches is rendered conductive by supplying d.c. voltage to the associated electronic gates and switches.

An additional object of this invention is to provide a new and improved fail-safe electronic low-pass filtering circuit which is economical in cost, unique in design, reliable in operation, durable in use, dependable in service, and simple to manufacture.

SUMMARY OF THE INVENTION

In accordance with the present invention, there is provided a vital type of solid-state low-pass filtering circuit which includes a plurality of electronic gates and switches for controlling the upper cutoff frequency level of an R-C network. Each of the plurality of electronic gates includes a PNP transistor having base, collector, and emitter electrodes. The base electrode is resistively connected to the junction point of a pair of voltage dividing resistors which are connected between a negative supply lead and a ground lead. The junction point of the pair of voltage dividing resistors is connected by a coupling capacitor to a source of a.c. signals. The collector electrode is directly connected to the negative supply lead while the emitter electrode is connected by a load resistor to the ground lead. The plurality of electronic gates each includes a field-effect transistor having gate, source, and drain electrodes. The source electrode is directly connected to the emitter electrode while the gate electrode is resistively connected to the negative supply lead. Each drain electrode is connected by a series resistor to a four-terminal filter capacitor. The upper cutoff frequency level is determined by which one of the plurality of PNP transistors and field-effect transistors is selectively rendered conductive by applying a negative d.c. voltage of its supply lead so that a.c. signals from the source are conveyed to the selected series resistor and filter capacitor.

BRIEF DESCRIPTION OF THE INVENTION

The foregoing objects and other additional features and advantages of this invention will become more fully evident from the foregoing detailed description when considered in conjunction with the accompanying drawing wherein:

The single FIGURE is a schematic circuit diagram of a vital or fail-safe electronic low-pass filtering circuit embodying the principles of the present invention.

DETAILED DESCRIPTION OF THE INVENTION

Referring now to the single FIGURE of the drawing, there is shown a preferred embodiment of the vital type of electronic low-pass filtering circuit for use in the overspeed control portion of a cab signaling system for railroad and mass/or rapid transit operation. As shown, the fail-safe filter arrangement includes an active control portion and a variable passive filter portion. It will be noted that the active portion is made up of a plurality of electronic gates and switches Q1-G1, Q2-G2, and QN-GN which are selectively rendered conductive by being individually supplied with a negative d.c. operating voltage as will be described hereinafter.

In a cab signaling system, the actual speed of the train or vehicle is produced by a suitable speed sensing unit, such as, an axle generator or tachometer. The generator or tachometer produces a.c. signals which have a frequency that is directly proportional to the speed of the moving vehicle or train. It will be appreciated that the a.c. signals produced by the speed sensing unit, after shaping and limiting, are applied to the input terminals 1 and 2. As previously mentioned, the coded speed command signals are picked up from the track rails by a pair of inductive coils mounted on the front end of the lead vehicle. The picked up signals are demodulated, amplified, shaped, limited, and decoded by the cab signal equipment. The recovered speed signals are applied to a speed command decoding unit 3. Generally, the decoding unit of the cab signal equipment includes a plurality of electromagnetic decoding relays which are energized and deenergized in accordance with the code rate or frequency of the various received coded cab signals. In practice, each relay includes a front contact which is either opened or closed in accordance with the electrical condition of the relay coil. The respective front contacts of the decoding relays are employed to selectively connect a negative voltage source (not shown) to one of a plurality of supply leads L1, L2, or L3 which furnish a biasing and operating potential to an associated solid-state gate and switch.

As shown, the first gate and switch includes a PNP transistor Q1 and a P-channel field-effect transistor (FET) G1. The first gating transistor Q1 includes a base electrode b1, a collector electrode c1, and an emitter electrode e1 while the first switching transistor G1 includes a gate electrode g1, a source electrode s1, and a drain electrode d1. As shown, the input base electrode of the first gating transistor Q1 which is arranged as an emitter-follower and is connected to the junction point J1 of a voltage dividing network via a resistor R1. The voltage divider includes a pair of biasing resistors R2 and R3 having their remote ends connected to negative supply lead L1 and ground lead L4. A coupling capacitor C1 is connected between the junction J1 of the voltage divider and the input terminal 1. The collector electrode c1 is directly connected to the negative voltage lead L1 while the emitter electrode e1 is connected to ground lead L4 via load resistor R4. The emitter electrode e1 is directly connected to the source electrode s1 of the first gating FET transistor G1. The gate electrode g1 is connected to the negative supply voltage lead L1 via resistor R5. The drain electrode d1 is connected by a series resistor R6 to one terminal of the upper plate of a four-terminal timing capacitor C. It will be seen that one terminal of the lower plate of the timing capacitor is connected to ground lead L4. As shown, the other terminals of the upper and lower plates of capacitor C are connected to the input of a vital type of d.c. voltage maker and level detector 4. The d.c. voltage maker may be of the type shown and disclosed in U.S. Pat. No. 3,527,986 while the level detector may be of the type shown and disclosed in U.S. Pat. No. 3,737,806. Briefly, the d.c. voltage maker is a fail-safe circuit including an amplifier 9 and a rectifier 21 as illustrated in FIG. 2a of U.S. Pat. No. 3,527,986. The amplifier-rectifier circuit operates in a fail-safe manner in that no critical circuit or component failure is capable of increasing the gain characteristics of the circuit. The level detector is also a fail-safe circuit which includes a feedback type of oscillator and a voltage breakdown device, namely, a Zener diode, as illustrated and described in U.S. Pat. No. 3,737,806. In practice, the a.c. oscillating signals are amplified and rectified and are then applied to a vital type of an overspeed control relay 5. As shown, the output of the circuit 4 is connected to the coil of the overspeed control relay 5. It will be appreciated that the overspeed relay 5 includes at least one contact, namely, front contact a which controls the circuit condition of the brake control apparatus of the vehicle or train. It will be seen that the front contact a is closed when the relay coil is energized by circuit 4 to cause energization of the service brake relay to hold the brakes in their released position. As will be described hereinafter, when the front contact a is released by the deenergization of the overspeed relay 5, the brake control circuit is interrupted, and the brakes are applied to cause deceleration of the moving vehicle or train.

As shown, the second switch and gate includes a PNP transistor Q2 and a P-channel field-effect transistor G2. The second gating transistor Q2 includes a base electrode b2, a collector electrode c2, and an emitter-electrode e2 while the second switching transistor G2 includes a gate electrode g2, a source electrode s2, and a drain electrode d2. It will be seen that the input base electrode b2 of the second gating emitter-follower transistor Q2 is connected to the junction point J2 of a voltage dividing network via a resistor R7. The voltage divider includes a pair of resistors R8 and R9 which are connected between negative supply lead L2 and ground lead L4. As shown, the junction J2 of resistors R8 and R3 is also connected to the input terminal 1 via a coupling capacitor C2. The collector electrode c2 is directly connected to the negative potential lead L2 while the emitter electrode e2 is connected by load resistor R10 to the ground lead L4. The emitter electrode e2 is directly connected to the source electrode s2 of the second gating FET Q2. The gate electrode g2 is connected to the negative potential lead L2 via resistor R11 while the drain electrode d2 is connected to the one terminal of the upper plate of the four-terminal filter capacitor C via a series resistor R12.

It will be seen that the final gate and switch includes a PNP transistor QN and a P-channel field-effect transistor gN. The final gating transistor QN includes a base electrode bN, a collector electrode cN, and an emitter electrode eN while the final switching transistor GN includes a gate electrode qN, a source electrode sN, and a drain electrode dN. As shown, the input base electrode bN of the final switching transistor QN is connected to the junction point J3 of a voltage dividing network via a resistor R13. The voltage divider includes a pair of resistors R14 and R15 which are connected between the negative voltage supply lead L3 and ground lead L4. It will be noted that the junction J3 of voltage dividing resistors R14 and R15 is also connected to the input terminal 1 via a coupling capacitor C3. The collector electrode cN is directly connected to the negative voltage supply lead L3, and the emitter electrode eN is connected to the ground lead L4 via a load resistor R16. The emitter electrode eN is directly connected to the source electrode sN of the final switching FET QN. The gate electrode gN is connected to the negative potential lead L3 via resistor R17, and the drain electrode dN is connected to the one terminal of the upper plate of the filter timing capacitor C via a series timing resistor R18.

In describing the operation, it will be assumed that the components and elements are intact and that the variable signal frequency filtering circuit and the entire cab signal system is functioning properly. In addition, let us assume that the present code rate being received on board the moving vehicle effectively results in the energization of an appropriate code following relay of the decoding unit 3 which causes the negative potential to appear on supply lead L1. As previously mentioned, only one of the decoding relays may be energized at any given time so that a negative biasing and operating voltage is only developed on one of the supply leads L1, L2, or L3. Further, let us assume that the leads L1, L2, and L3 are representative of progressive higher vehicle speeds so that lead L1 represents the lowest speed while lead L2 is higher than lead L1, and lead L3 is the highest speed. Accordingly, the resistances of resistors R6, R12, and R18 have been selected to be progressively higher in value. Thus, the resistive value of resistor R6 is the lowest while the resistance of resistor R12 is higher than that of resistor R6, and the resistive value of resistor R18 is the highest of all three resistors. When the negative potential is developed on lead L1 so the biasing and operating voltages are supplied to gating transistor Q1, and a negative gating voltage is applied to the gate electrode g1 to turn ON the switching FET Q2. Thus, the a.c. input signals developed by the axle generator which appear on input terminals 1 and 2 are current amplified by the unity gain transistor amplifier Q1. The amplified signals are conveyed to the low-pass filter consisting of resistor R6 and capacitor C via the source and drain electrodes s1, d1 of FET Q2. It will be appreciated that the a.c. signals produced by the axle generator will be readily passed by the R-C filter network so long as the frequency which is proportional to the vehicle speed remains below a given value, namely, below the authorized speed set by the speed command decoding unit 3. Thus, the a.c. signals passed by the low-pass filter network are fed to the circuit where the d.c. maker and the level detector produce an output for energizing the overspeed control relay 5. Accordingly, the front contact a is closed to complete the circuit to the service brake control apparatus to preclude the application of the service brakes.

Let us assume that the speed of the vehicle increases and exceeds the authorized speed command which is representative of the negative voltage on lead L1, such as, for example, 15 mph. Now when the frequency of the axle generator signals exceeds the rolloff or cutoff point of the low-pass filter, namely, $\frac{1}{2}\pi R6C$, the a.c. signals are attenuated by the filter. It will be appreciated that at a preselected point the d.c. voltage of the d.c. voltage maker will become less than the breakdown voltage of the Zener diode of the level detector. Thus, the circuit 4 no longer produces an output signal and results in the deenergization of the overspeed control relay 5. The release of the electromagnetic relay 5 causes the opening of the front contact a which results in the interruption of the circuit to the brake control apparatus. Thus, the service brakes of the vehicle are applied to slow down and bring the vehicle within the authorized speed command level for the given area or the section of trackway. The relay 5 will remain deenergized and the contact a so long as the frequency of the a.c. signals produced by the tachometer causes the d.c. maker to produce a voltage which is less than the breakdown level of the Zener diode of the level detector.

Now if a new authorized speed command, such as, a medium or high, is received on board the vehicle, either the lead L2 or lead L3 is furnished with a negative supply voltage by the speed command decoding unit 3. The appearance of the negative d.c. potential on lead L2 causes the a.c. tachometer signals to be conveyed by transistors Q2, G2 to a low-pass filter consisting of resistor R12 and capacitor C while the appearance of the negative d.c. potential on lead L3 causes the a.c. tachometer signals to be conveyed by transistors QN GN to a low-pass filter consisting of resistor R18 and capacitor C. It will be appreciated that the rolloff point for the medium speed is $\frac{1}{2}\pi R12C$ while the rolloff point for the high speed is $\frac{1}{2}\pi R18C$. Thus, the response curve remains substantially flat up to the rolloff points wherein the low-pass filters exhibit an attenuating effect for higher frequencies. It will be appreciated that the slopes of the response curves which are representative of the loss or attenuation of the filters are are identical, and in each case, are 6 db per octave or 20 db per decade. Thus, the level at which the d.c. voltage maker causes the level detector to deenergize the overspeed control relay 5 is substantially the same for all of the filter networks. Accordingly, an extremely wide range of resistance values may be used to drive the four-terminal capacitor C since each filter section is independent of each other. Fur Further, each filter section is arranged to deliver the same output voltage at its selected overspeed frequency.

In addition, it will be noted that the presently described low-pass filter circuit exhibits a high immunity to ripple voltage on the negative potential source which is supplied to leads L1, L2, and L3. This is due to the fact that the output of an emitter-follower amplifier is not affected by variations in its collector voltage unless the collector effectively drops below the input signal voltage on its base electrode. Further, it will be appreciated that the use of the FETs ensures that their output resistors and the load resistors of the emitter-followers do not shunt the four-terminal capacitor which would upset the filtering action of the activated filter section. In practice, an enhancement mode FET is preferred since such a semiconductive device is turned off when the negative supply voltage drops to a few volts while an ordinary transistor would continue to conduct until the negative supply voltage reached a fraction of a volt which results in a lag and a slowing down of the ability to switch from one speed to another by the cab signal equipment.

As previously mentioned, the circuit operates in a fail-safe manner in that no critical component or circuit failure is capable of increasing the particular rolloff frequency of any of the filter sections. It will be appreciated that certain precautionary measures must be employed in designing and laying out the circuit in order to ensure that shorts and crossovers will not occur between the adjacent leads. Further, it will be understood that the critical resistors are preferably constructed of a suitable composition so that they are incapable of becoming short-circuited. It will be appreciated that the use of the four-terminal capacitor C ensures that the loss of a lead wire will not create an unsafe condition. Further, it will be observed that failure of the other passive or active elements results in the elimination of the necessary biasing and operating potentials or causes a decrease in the output signal which is a safe failure.

It will be readily evident that while the invention has been described in relation to cab signal equipment, it is understood that the invention may be used in other systems, such as, security, anti-collision, and other monitoring equipment and apparatus.

In addition, it will be appreciated that various changes, modifications, and alterations may be made by those skilled in the art without departing from the spirit and scope of this invention. For example, NPN transistors and N-channel FETs may be used in place of those shown by simply changing the polarity of the supply voltage. Further, the number of gate and switch sections may be increased or decreased to accommodate a greater or lesser number of speed commands. Additionally, that last filter section may be representative of the lowest speed while the first filter section may be representative of the highest speed. It will also be apparent that other changes, alterations, and equivalents may be made to the presently described invention, and therefore, all modifications and changes within the spirit and scope of this invention are herein meant to be included in the appended claims.

Having thus described the invention, what I claim as new and desire to secure by Letters Patent, is:

1. A vital circuit arrangement comprising, a source of a.c. signals having a variable frequency, a plurality of electronic gates having their inputs coupled to said source of a.c. signals, one of a plurality of electronic switches coupled to the output of an associated one of said plurality of electronic gates, and a variable low-pass filter network having an upper signal frequency limit which is determined by which of said associate electronic gates and switches is rendered conductive by supplying a d.c. voltage to said associated gates and switches.

2. The vital circuit arrangement as defined in claim 1, wherein said plurality of electronic gates each include an emitter-follower amplifier which provides a high immunity to ripple voltage which may appear on said d.c. voltage.

3. The vital circuit arrangement as defined in claim 1, wherein said plurality of electronic switches each include a field-effect transistor which ensures that said low-pass filter network is not unduly loaded.

4. The vital circuit arrangement as defined in claim 1, wherein said plurality of electronic gates each include a PNP transistor.

5. The vital circuit arrangement as defined in claim 1, wherein said variable low-pass filter network includes selected ones of a plurality of resistors and a capacitor.

6. The vital circuit arrangement as defined in claim 1, wherein said variable low-pass filter network includes a series R-C circuit.

7. The vital circuit arrangement as defined in claim 1, wherein said variable low-pass filter network includes one of a plurality of series resistors and a four-terminal capacitor.

8. The vital circuit arrangement as defined in claim 1, wherein said plurality of electronic gates each include a unity gain amplifying circuit.

9. The vital circuit arrangement as defined in claim 1, wherein said plurality of electronic gates each includes a transistor having a base electrode, a collector electrode and an emitter electrode, a voltage divider including a first and a second resistor connected between said d.c. voltage and a reference point, a third resistor connecting the base electrode to the junction point of said first and second resistors, a capacitor connecting the junction point of said first and second resistors to said source of a.c. signals, a fourth resistor connecting said emitter electrode to said reference point, and said collector electrode connected to said d.c. voltage.

10. The vital circuit arrangement as defined in claim 9 wherein said plurality of electronic switches each includes a field-effect transistor having a gate electrode, a source electrode and a drain electrode, said source electrode connected to said emitter electrode, a fifth resistor connecting said gate electrode to said d.c. voltage, and said drain electrode connected by a sixth resistor to a filtering capacitor.

* * * * *